United States Patent
Novogran et al.

(10) Patent No.: US 11,023,388 B2
(45) Date of Patent: Jun. 1, 2021

(54) DATA PATH PROTECTION PARITY DETERMINATION FOR DATA PATTERNS IN STORAGE DEVICES

(71) Applicant: SK hynix Inc., Gyeonggi-do (KR)

(72) Inventors: Igor Novogran, Minsk (BY); Andrei Konan, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/549,523

(22) Filed: Aug. 23, 2019

(65) Prior Publication Data
US 2020/0097416 A1   Mar. 26, 2020

Related U.S. Application Data

(60) Provisional application No. 62/734,654, filed on Sep. 21, 2018.

(51) Int. Cl.
| G06F 12/14 | (2006.01) |
| G06F 13/16 | (2006.01) |
| G11C 29/18 | (2006.01) |

(52) U.S. Cl.
CPC ...... *G06F 12/1416* (2013.01); *G06F 13/1684* (2013.01); *G11C 29/18* (2013.01); *G06F 2212/1024* (2013.01)

(58) Field of Classification Search
CPC .... G06F 3/0619; G06F 11/10; G06F 11/1008; G06F 11/1076
See application file for complete search history.

(56) References Cited

U.S. PATENT DOCUMENTS

| 8,671,250 | B2 | 3/2014 | Lee | |
| 9,639,457 | B1* | 5/2017 | Piszczek | G06F 11/1076 |
| 10,705,749 | B2* | 7/2020 | Cheng | G06F 3/0679 |
| 2016/0085625 | A1* | 3/2016 | Amato | G06F 3/0679 |
| | | | | 714/766 |
| 2018/0039538 | A1 | 2/2018 | Freikorn et al. | |
| 2019/0087122 | A1* | 3/2019 | Shinozuka | G06F 3/0619 |
| 2019/0310915 | A1* | 10/2019 | Camp | G06F 3/061 |
| 2020/0065186 | A1* | 2/2020 | Palmer | G06F 11/1048 |

OTHER PUBLICATIONS

Micheloni et al., Cyclic codes, Error Correction Codes for Non-Volatile Memories, Jun. 3, 2008, p. 43, ISBN 978-1-4020-8391-4, Springer.
Eiji Fujiwara, Code Design for Dependable Systems: Theory and Practical Applications, Oct. 7, 2005, p. 11, ISBN: 9780471792741, Wiley-Interscience.

* cited by examiner

*Primary Examiner* — Edward J Dudek, Jr.
(74) *Attorney, Agent, or Firm* — IP & T Group LLP

(57) ABSTRACT

Techniques are presented that more efficiently calculate data path protection (DPP) parity. Firmware is advantageously used for such calculation with limited or no calls to a DPP engine, depending on the type of host data. The techniques use linear code properties of the type of host data to enable the firmware to calculate DPP parity faster than using the DPP engine for all calculations.

20 Claims, 6 Drawing Sheets

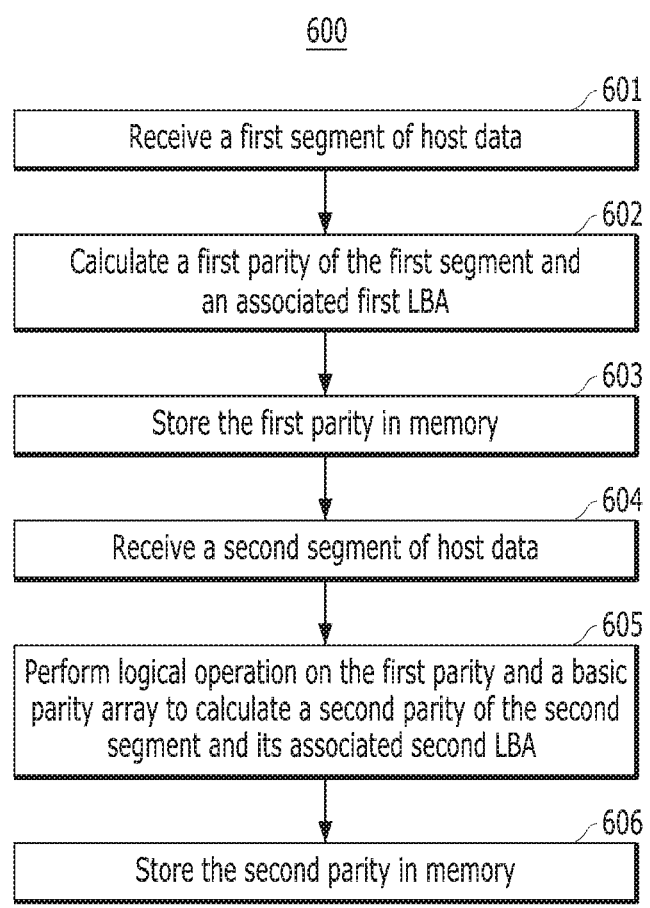

DATA PATH PROTECTION PARITY DETERMINATION FOR DATA PATTERNS IN STORAGE DEVICES

CROSS-REFERENCE TO RELATED APPLICATION

This application claims the benefit of U.S. Provisional Application No. 62/734,654, filed Sep. 21, 2018, the entire content of which is incorporated herein by reference.

BACKGROUND

1. Field

Embodiments of the present disclosure relate to devices and methods for calculating data path protection (DPP) parity for defined data.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes electronics that bridge the flash memory components to the SSD input/output (I/O) interfaces. The SSD controller may include an embedded microprocessor that executes functional components such as firmware. The SSD functional components are typically device specific, and in most cases, can be updated.

The two main types of flash memories are named after the NAND and NOR logic gates. The individual flash memory cells exhibit is internal characteristics similar to those of their corresponding gates. The NAND-type flash memory may be written to and read from in blocks (or pages) which are generally much smaller than the entire memory space. The NOR-type flash memory allows a single machine word (byte) to be written to an erased location or read independently. The NAND-type flash memory operates primarily in memory cards, USB flash drives, SSDs, and similar products, for general storage and transfer of data.

A flash-based storage device typically includes one or more flash chips, a microprocessor, volatile random access memory (RAM), which may be embedded or provided externally, and firmware that runs on the microprocessor. One function of a flash-based storage device is to provide a standard block interface for the flash chip(s) in the device to communicate with a host. The firmware uses RAM resources not only as storage for its internal data but also as a temporary storage for data received from a host during processing of a host read/write operation. DPP mechanisms are employed to protect host data from corruption in RAM.

In this context, embodiments of the present invention arise.

SUMMARY

Embodiments of the present invention are directed to faster more efficient techniques for calculating data path protection (DPP) parity.

Accordingly, an aspect of present invention includes a method for operating a memory controller to calculate data path protection (DPP) parity. Such method generally comprises receiving a first segment of host data; calculating a first parity of the first segment and an associated first logical block address (LBA); receiving a second segment of host data; and performing a logical operation on the first parity and a basic parity array to calculate a second parity of the second segment and its associated second LBA, the basic parity array being known to the memory controller based in part on the first and second segments.

Another aspect of the present invention is directed to a memory controller that comprises a processor configured to run firmware; a DPP engine in communication with the firmware; and a host interface configured to receive host data of a defined type, the host data comprised of multiple segments including a first segment and second segment. The DPP engine calculates a first parity of the first segment and an associated first LBA, whereas the firmware calculates a second parity of the second segment and an associated second LBA based on properties of the defined type of host data, which properties are known to the firmware after the first parity is calculated.

In another aspect of the present invention, a method for operating a memory controller to calculate DPP parity. The method comprises processing specific host data; determining whether DPP parity has been calculated for all LBAs of the specific host data; obtaining a next LBA for which DPP parity has not been calculated; calling a DPP engine of the memory controller to calculate the DPP parity for the next LBA and its associated piece of the specific host data, when the next LBA is the first LBA; executing firmware running on a processor of the memory controller to calculate the DPP parity for the next LBA and its associated piece of the specific host data, when the next LBA is not the first LBA. To calculate the DPP parity for the next LBA and its associated piece of specific host data, the firmware calculates the exclusive OR (XOR) difference between the next LBA and the immediately previously processed LBA.

Additional aspects of the present invention will become apparent from the following description.

BRIEF DESCRIPTION OF THE DRAWINGS

FIG. 6 is a flow chart illustrating processes of calculating DPP parity in accordance with embodiments of the present invention.

DETAILED DESCRIPTION

Figure 1:
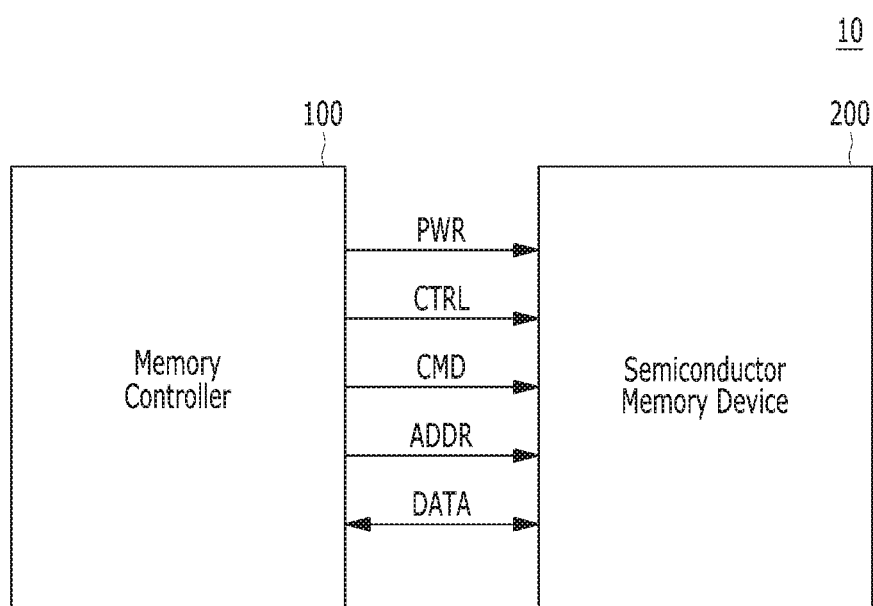
FIG. 1 is a diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 are preferably flash memory device(s), particularly of the NAND-type.

The memory controller 100 may control overall operations of the semiconductor memory device 200. For simplicity, the memory controller 100 and semiconductor memory device 200 may sometimes be referred to below simply as controller 100 and memory device 200, respectively.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a powerline and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
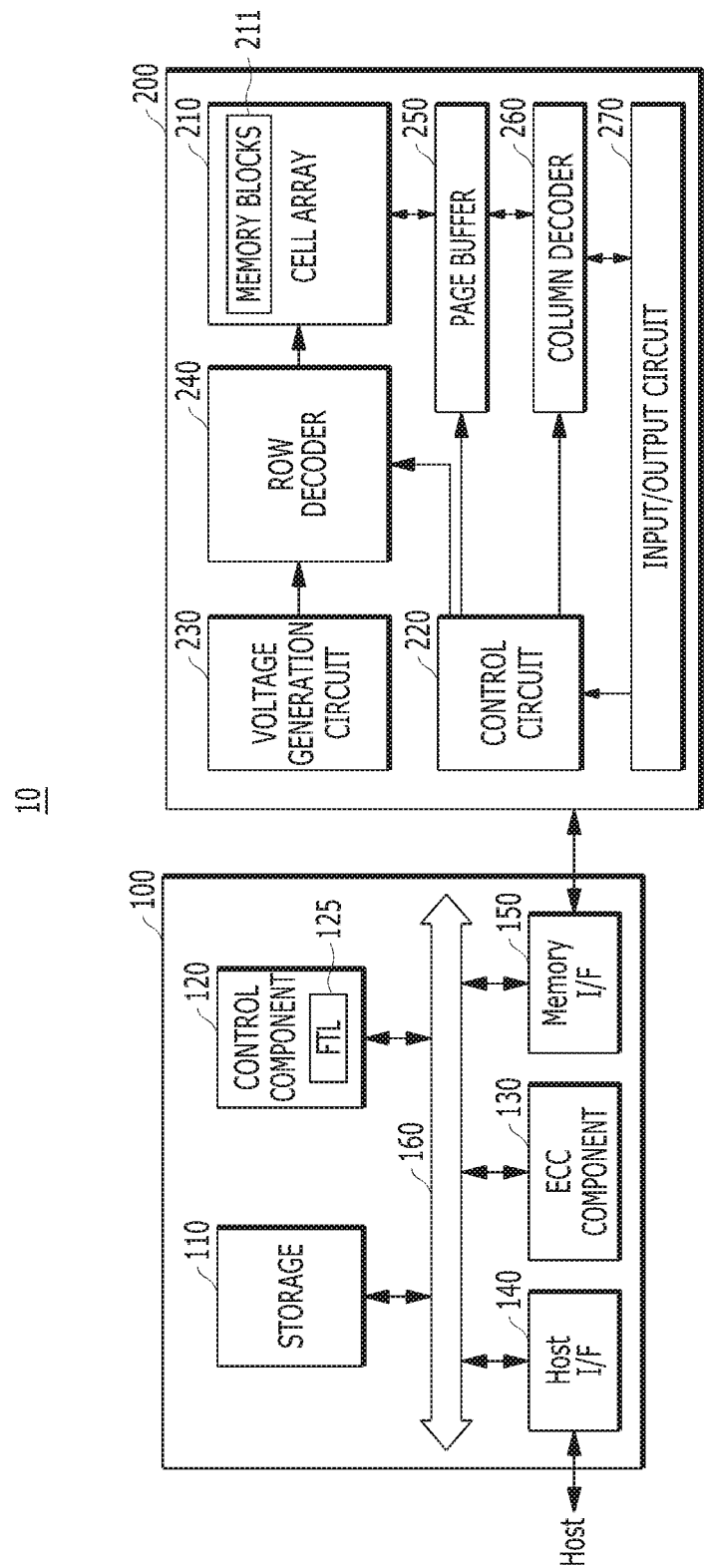
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, referred to as a flash translation layer (FTL) 125, to control general operations of the memory system 10. For example, the FTL 125 may perform operations such as logical-to-physical (L2P) mapping, wear leveling, garbage collection (GC), and/or bad block handling. The FTL 125 may be imlemented, as firmware, in the controller 100, and more specifically, in the control component 120. The L2P mapping is known as logical block addressing.

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation, such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). The ECC component 130 may include any and all circuits, systems or devices for suitable error correction operation.

The host interface 140 may communicate with the host device through one or more of various interface protocols, such as a universal serial bus (USB), a multi-media card (MMC), peripheral component interconnect express (PCI-e or PCIe), a small computer system interface (SCSI), a serial-attached SCSI (SAS), a serial advanced technology attachment (SATA), a parallel advanced technology attachment (PATA), non-volatile memory express (NVMe), an enhanced small disk interface (ESDI), and integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component (or CPU) 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer (array) 250, which may be in the form of an array of page buffers, a column decoder 260, and an input/output circuit 270. The memory cell array 210 may include a plurality of memory blocks 211 which may store data. Subsets of the memory blocks may be grouped into respective super blocks for certain operations.

The voltage generation circuit 230, the row decoder 240, the page buffer (array) 250, the column decoder 260 and the input/output is circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
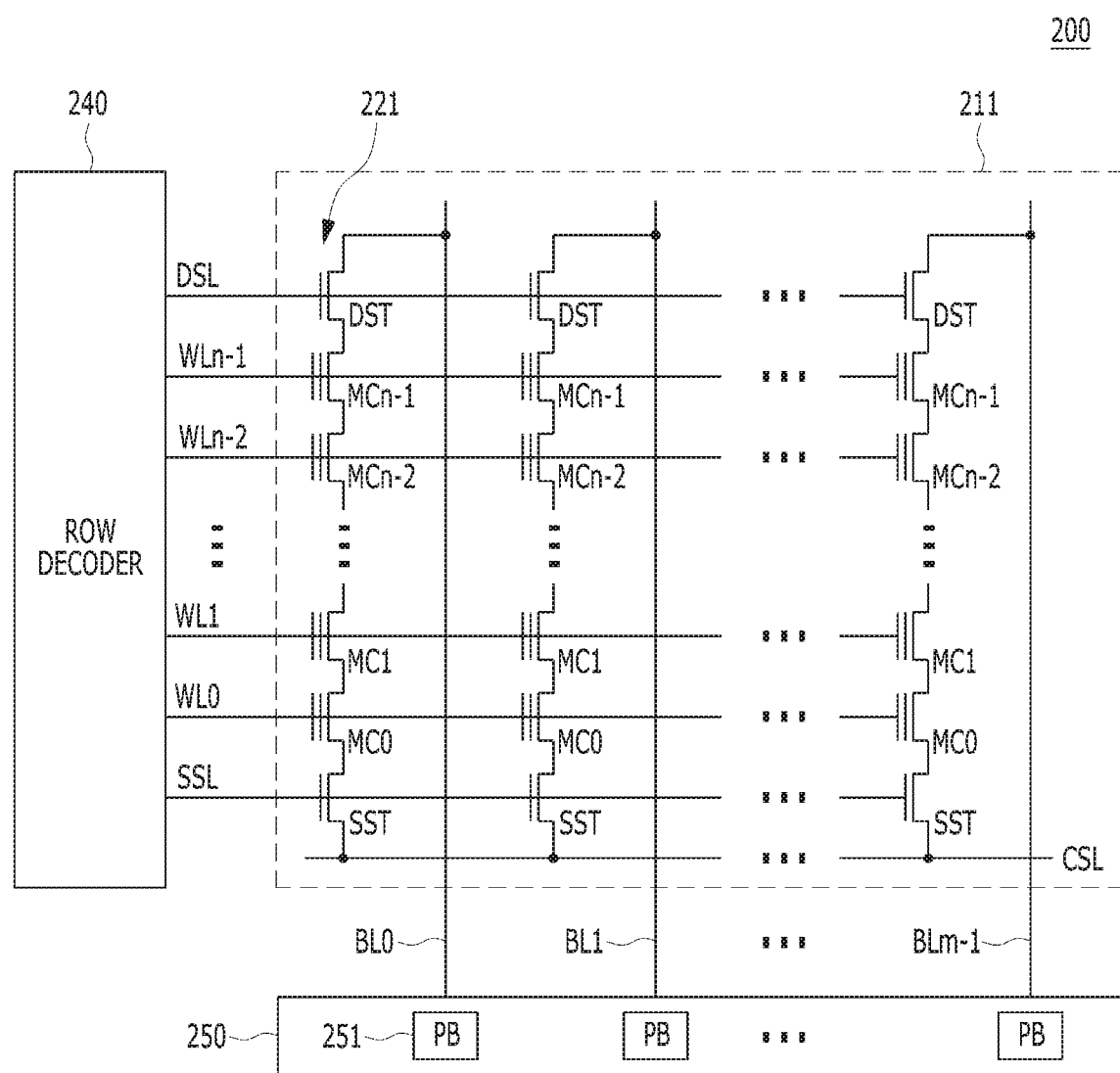
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer (array) 250 may be in the form of a page buffer array including a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
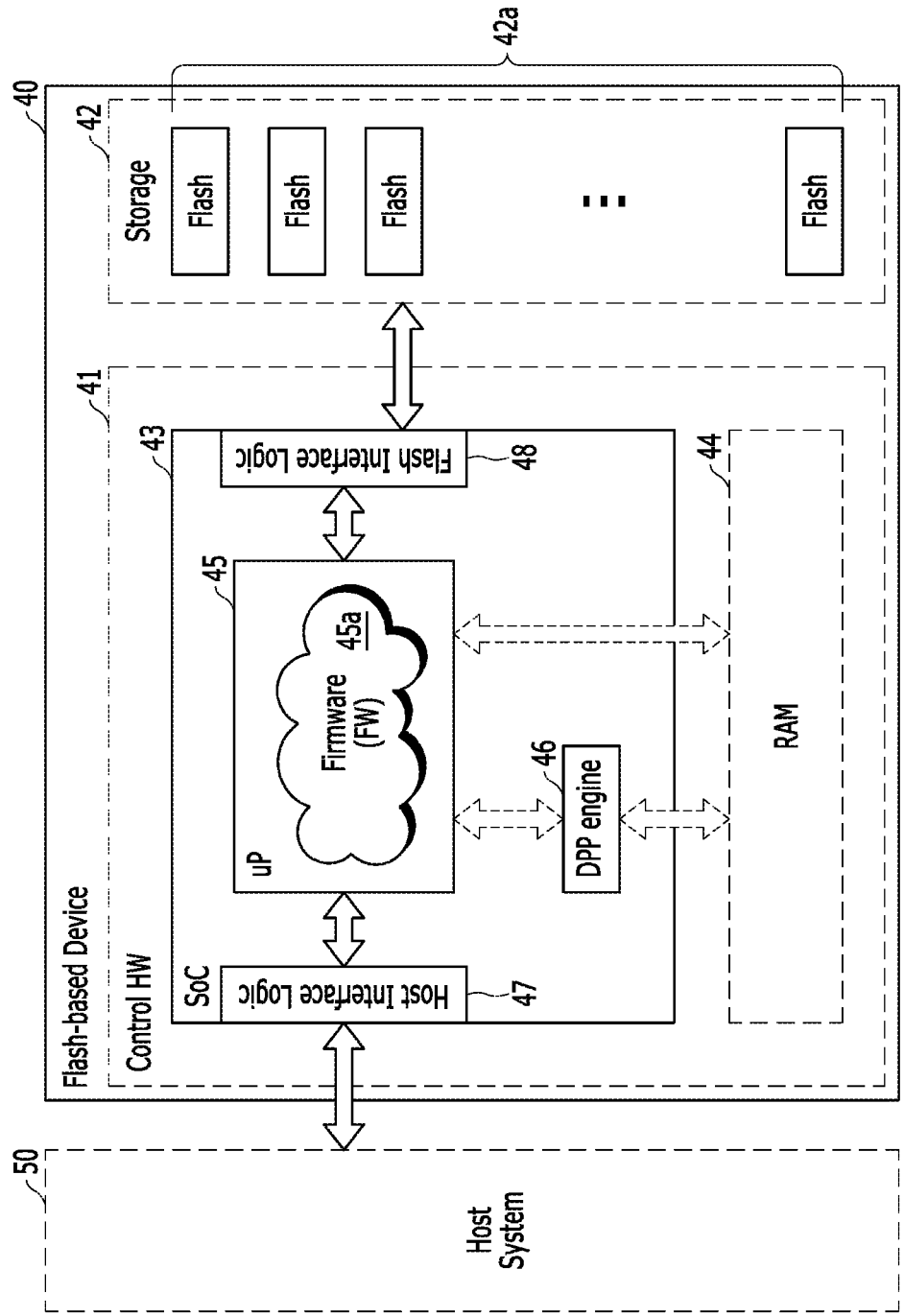
FIG. 4 is a logical diagram illustrating a flash-based storage device in accordance with an embodiment of the present invention.

As previously noted, the memory controller 100 and the semiconductor memory device 200 may be integrated into a single device such as an SSD or other flash-based storage device. Referring to FIG. 4, an exemplary flash-based storage device 40 is illustrated. Flash-based device 40, which may be another embodiment of memory system 10, is shown here with a somewhat different layout to highlight features and aspects of the present invention. The flash-based device 40 may include a controller 41 (Control HW) and a storage 42, which generally correspond to the memory controller 100 and memory device 200, respectively, of FIG. 2. The storage 42 may include multiple flash chips collectively identified by 42a.

The controller 41 may include a system-on-chip (SoC) 43, on or in which are embedded various components described below. The controller 41 may further include a random access memory (RAM) 44, such as that included in storage 110.

The SoC 43 includes a processor, which may be an embedded microprocessor (pP) 45 and a DPP engine 46 in communication with the microprocessor 45. Firmware 45a runs on the microprocessor 45, which is in communication with the RAM 44. The SoC 43 further includes host interface logic 47 in communication with the microprocessor 45 and also in communication with a host 50. Flash interface logic 48 on the SoC 43 provides communication between the SoC 43 and the storage 42.

As previously noted, in flash-based storage devices, data path protection (DPP) mechanisms are employed to protect host data from corruption in RAM. Such mechanisms involve calculating a check value from raw host data for further error detection and correction. Usually, a linear code, e.g., cyclic redundancy check (CRC), is used for DPP parity calculation. For better performance, a hardware (HW) engine is used for DPP parity check and calculation.

Embodiments of the present invention provide techniques for more efficiently calculating DPP parity for certain defined host data. The inventive techniques use properties of linear codes that allow calculating DPP parity faster than a HW engine.

A linear code, defined as G, has the following property:

$$G(a \oplus b) = G(a) \oplus G(b)$$

Assume that the FW 45a receives a piece of raw host data a and calls the DPP engine 46 to calculate DPP parity G(a). Then, the FW 45a receives another piece of raw host data b. At that time, though, certain information is available to the FW 45a. That is, the FW 45a knows certain information denoted as $\Delta$ from the following relationship: $b = a \oplus \Delta$, and also knows $G(\Delta)$. In this case, the FW 45a can easily calculate DPP parity for b, without calling the DPP engine 46, using the following property of the above linear code:

$$G(b) = G(a) \oplus G(\Delta)$$

DPP parity is calculated from an LBA value and the host data which relates to the LBA. However, there are several cases when the host data is the same for some range of LBAs, e.g., Write Zeros Command (WZC), Write the Same Command (WSC), etc. Without any optimization, the FW 45a has to call the DPP engine 46 to calculate DPP parity for each LBA and related host data. This significantly reduces performance especially when the range of LBAs is large. Also, during processing of such commands, the DPP engine 46 is not available for other tasks, such as parity verification of data loaded from NAND.

To show how to avoid performance degradation during processing of WSC for some range of LBAs, it is assumed that the FW 45a receives a WSC for LBA 0 and LBA 1 (where the size of an LBA is 4 Bytes). The following array of pre-calculated DPP parties should be available for the FW 45a, denoted as BasicParities, and defined as follows: (1) the array has 32 elements; and (2) an $i^{th}$ element of the array is $G(x_i)$, where all bits of $x_i$ equal zero, except the $i^{th}$ bit.

With this in mind, define LBA 0 and host data as a, and LBA 1 and host data as b. For LBA 0 and the host data, the FW 45a calls the DPP engine 46 to calculate parity, defined as G(a). Taking into account that the host data is the same for both LBAs and that LBA 0 and LBA 1 are different only in one bit at position 0, DPP parity can be calculated by the FW 45a itself from G(a):

$$G(b)=G(a)\oplus BasicParities[0]$$

Figure 5:
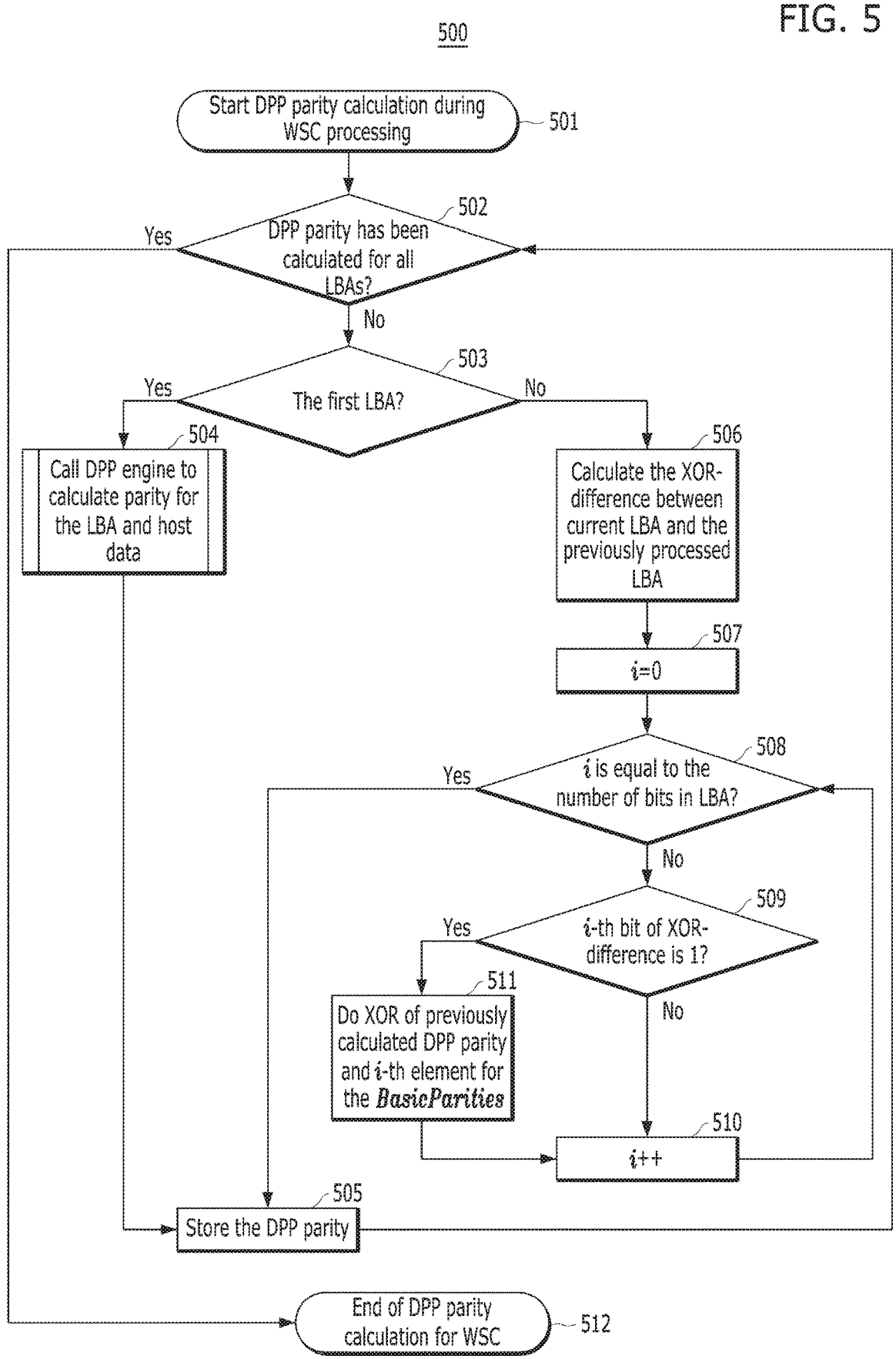
FIG. 5 is a flow chart illustrating DPP parity calculation during is processing of a write the same command (WSC) in accordance with an embodiment of the present invention.

FIG. 5 is a flow chart 500 illustrating DPP parity calculation during processing of a WSC by the FW 45a, in accordance with an embodiment of the present invention.

In step 501 DPP parity calculation is started during the processing of a WSC. At step 502, it is determined whether or not DPP parity has been calculated for all LBAs of the WSC host data. This step is somewhat trivial at the start of the processing, but becomes more significant as the processing iterations increase.

When there is at least one LBA for which DPP parity has not been calculated (No at step 502), it is then determined at step 503 whether the current LBA (in a sequence of LBAs) is the first LBA, which is treated differently than the second and subsequent LBAs. If the next LBA is the first LBA (Yes at step 503), processing moves to step 504, where the DPP engine 46 is called to calculate the DPP parity for the first LBA and associated host data. Following that calculation, that DPP parity is stored, e.g., in RAM 44, at step 505.

After storing the DPP parity for the first LBA, the process returns to step 502. If there is a second (or another) LBA for which a DPP parity is to be calculated, flow passes through the "No" branches of steps 502 and 503 to step 506.

At step 506, the firmware 45a is used to make calculations. More specifically, at step 506, the firmware 45a calculates the XOR difference between the current LBA and the immediately previous LBA that has already been processed. In step 507, processing variable, i, is set to 0.

At step 508, it is determined whether or not the number of bits in the current LBA is equal to i. Essentially, this step acts as counter for processing bits in the current LBA. Initially, the determination at step 508 is "No" and at each pass it continues to be "No", the flow moves to step 509, where it is determined whether or not the $i^{th}$ bit of the XOR difference is 1. If not, i is incremented at step 510, after which the determination at step 508 is made again. This loop of steps 508, 509 and 510 continues until, at step 509, it is determined that the $i^{th}$ bit of the XOR difference is 1.

When this happens (Yes at step 509), a further calculation is performed at step 511. An XOR operation is performed on previously calculated DPP parity and the $i^{th}$ element of the BasicParities. After that, i is incremented and the process returns to step 508. Processing continues within the loops defined by steps 508-511, until is finally determined that i is equal to the number of bits in the current LBA. When that happens (Yes at step 508), the DPP parity calculations made at step 511 are stored at step 505. Such calculations may be stored in RAM 44.

After each DPP parity storage occurrence (step 505), the process returns to step 502, where it is once again considered whether DPP parities have been calculated for all LBAs. If not, the processing continues as previously described. If so (Yes at step 502), the DPP parity calculation process ends (step 512).

FIG. 6 is a flow chart 600 describing steps in processes of DPP parity calculation, in accordance with embodiments of the present invention. The steps shown in flow chart 600 are exemplary. Those skilled in the art will understand that additional and/or alternative steps may be performed, or that the order of steps may be changed, to effectuate aspects of the present invention without departing from the is inventive concepts disclosed herein.

At step 601, a first segment of host data is received by the memory system, e.g., flash-based device 40. At step 602, a first DPP parity of the first segment and its associated first LBA is calculated. For certain host data, e.g., WSC, the DPP engine 46 is called to calculate the first DPP parity. After being calculated, the first DPP parity is stored in memory, e.g., RAM 44, at step 603.

At step 604, a second segment of host data is received by flash-based device 40. For this segment and all subsequent segments, at step 605, the firmware 45a is executed to calculate a second DPP parity by performing a logical operation, e.g., XOR operation, on the immediately the first DPP parity and a basic parity array. More generally, the firmware 45a calculates the DPP parity for each of the second and subsequent segments of host data by performing a logical operation, e.g., XOR operation, on the immediately previously calculated DPP parity and the basic parity array.

At step 606, the second parity is stored in memory. More generally, each of the second and subsequent parities is stored in memory after being calculated.

As the foregoing demonstrates, embodiments of the present invention provide techniques to more efficiently calculate DPP parity. Firmware is advantageously used for such calculation with limited or no calls to the DPP engine, depending on the type of host data.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A method for operating a memory controller to calculate data path protection (DPP) parity, the method comprising:
   receiving a first segment of host data;
   calculating a first parity of the first segment and an associated first logical block address (LBA);
   receiving a second segment of host data; and
   performing a logical operation on the first parity and a basic parity array to calculate a second parity of the second segment and its associated second LBA, the basic parity array being known to the memory controller based in part on the first and second segments and the basic parity array, which comprises a plurality of elements, one of which comprises a function of multiple bits, all but one of which are the same logic value.

2. The method of claim 1, wherein the logical operation is an exclusive-OR (XOR) operation.

3. The method of claim 1, wherein the basic parity array represents pre-calculated DPP parities.

4. The method of claim 1, wherein the plurality of elements of the basic parity array includes an $i^{th}$ element of which is represented by a function an input to which is represented by multiple bits, all of the multiple bits of the $i^{th}$ element being 0 except an $i^{th}$ bit which is 1, where i represents the order of the element in the basic parity array and the order of the bit among the multiple bits.

5. The method of claim 1, wherein the second parity is calculated by firmware of the memory controller.

6. The method of claim 5, wherein, when the first and second segments of host data are of a first type, the method further comprises:
   calling a DPP engine of the memory controller to calculate the first parity.

7. The method of claim 5, wherein, when the first and second segments of host data are of a second type, the first parity is calculated by the firmware.

8. The method of claim 6, wherein the first type is write the same command.

9. The method of claim 7, wherein the second type is write zeros command.

10. The method of claim 1, further comprising:
storing each of the first parity and the second parity in a memory of the memory controller.

11. A memory controller comprising:
a processor configured to run firmware;
a data protection path (DPP) engine in communication with the firmware; and
a host interface configured to receive host data of a defined type, the host data comprised of multiple segments including a first segment and second segment;
wherein the DPP engine calculates a first parity of the first segment and an associated first logical block address (LBA), and
wherein the firmware calculates a second parity of the second segment and an associated second LBA based on the first parity and a basic parity array known to the firmware after the first parity is calculated, the basic parity array comprising a plurality of elements, one of which comprises a function of multiple bits, all but one of which are the same logic value.

12. The memory controller of claim 11, wherein the firmware calculates the second parity by performing a logical operation on the first parity and a basic parity array, which is known to the firmware at the time of calculating the second parity.

13. The memory controller of claim 12, wherein the logical operation is an exclusive-OR (XOR) operation.

14. The memory controller of claim 12, wherein the basic parity array represents pre-calculated DPP parities.

15. The memory controller of claim 12, wherein the plurality of elements of the basic parity array includes an $i^{th}$ element of which is represented by a function an input to which is represented by multiple bits, all of the multiple bits of the $i^{th}$ element being 0 except an $i^{th}$ bit which is 1, where i represents the order of the element in the basic parity array and the order of the bit among the multiple bits.

16. The memory controller of claim 11, wherein the firmware calculates each subsequent parity of each of the subsequent segments of the host data and the LBA of the corresponding subsequent parity.

17. The memory controller of claim 11, further comprising:
a memory in which each of the first parity and the second parity in stored after being calculated.

18. A method for operating a memory controller to calculate data path protection (DPP) parity, the method comprising:
processing specific host data;
determining whether DPP parity has been calculated for all logical block addresses (LBAs) of the specific host data;
obtaining a next LBA for which DPP parity has not been calculated;
calling a DPP engine of the memory controller to calculate the DPP parity for the next LBA and its associated piece of the specific host data, when the next LBA is the first LBA;
executing firmware running on a processor of the memory controller to calculate the DPP parity for the next LBA and its associated piece of the specific host data, when the next LBA is not the first LBA,
wherein, to calculate the DPP parity for the next LBA and its associated piece of specific host data, the firmware calculates the exclusive OR (XOR) difference between the next LBA and the immediately previously processed LBA.

19. The method of claim 18, wherein, to calculate the DPP parity for the next LBA and its associated piece of specific host data, the firmware also calculates, when an $i^{th}$ bit of the XOR difference is 1, the XOR of the immediately previously calculated DPP parity and an $i^{th}$ element of a basic parity array, where i represents the order of the element in the basic parity array and the order of the bit of the XOR difference.

20. The method of claim 18, wherein the specific host data comprises write the same command.

* * * * *